United States Patent [19]

Kuligowski et al.

[11] B 4,012,746

[45] Mar. 15, 1977

[54] APPARATUS FOR RECORDING VARIABLE MEASUREMENT QUANTITIES THAT CAN BE TRANSLATED INTO ELECTRICAL CURRENT OR VOLTAGE VARIATIONS

[75] Inventors: Gerd Kuligowski; Konrad Von Hessberg, both of Berlin, Germany

[73] Assignee: Siemens Aktiengesellschaft, Munich, Germany

[22] Filed: Jan. 27, 1975

[21] Appl. No.: 545,344

[44] Published under the second Trial Voluntary Protest Program on March 30, 1976 as document No. B 545,344.

[30] Foreign Application Priority Data

Jan. 29, 1974 Germany .......................... 2404550

[52] U.S. Cl. .............................. 346/35; 346/107 R; 346/108
[51] Int. Cl.² ....................... G01D 9/28; G01D 9/42
[58] Field of Search ................. 346/35, 107 R, 108; 340/15.5 A, 15.5 AC, 15.5 AP

[56] References Cited

UNITED STATES PATENTS 3,781,783 12/1973 Tucker ..................... 346/108 X
3,803,631 4/1974 Nucklos et al. ................. 346/35

Primary Examiner—L. T. Hix
Assistant Examiner—Stanley J. Witkowski
Attorney, Agent, or Firm—Kenyon & Kenyon Reilly Carr & Chapin

[57] ABSTRACT

An apparatus for optically recording on a light sensitive record carrier variable measurement quantities that can be transformed into electrical current or voltage variations includes a row of light-emitting elements arranged transversely to the direction of motion of the record carrier and, in addition, an amplitude discriminator arrangement, including an integration arrangement, for addressing such elements. The output of the integration arrangement is connected to the inputs of comparators included in the discriminator, the latter comparators being also addressed, respectively, by the measurement quantities to be recorded. The outputs of the comparators are, in turn, connected to an OR logic circuit which controls an electronic switch. In an auxiliary circuit, this switch is arranged in series with further electronic switches and the light-emitting components. The further electronic switches are actuated by a cyclically operating control device.

8 Claims, 3 Drawing Figures

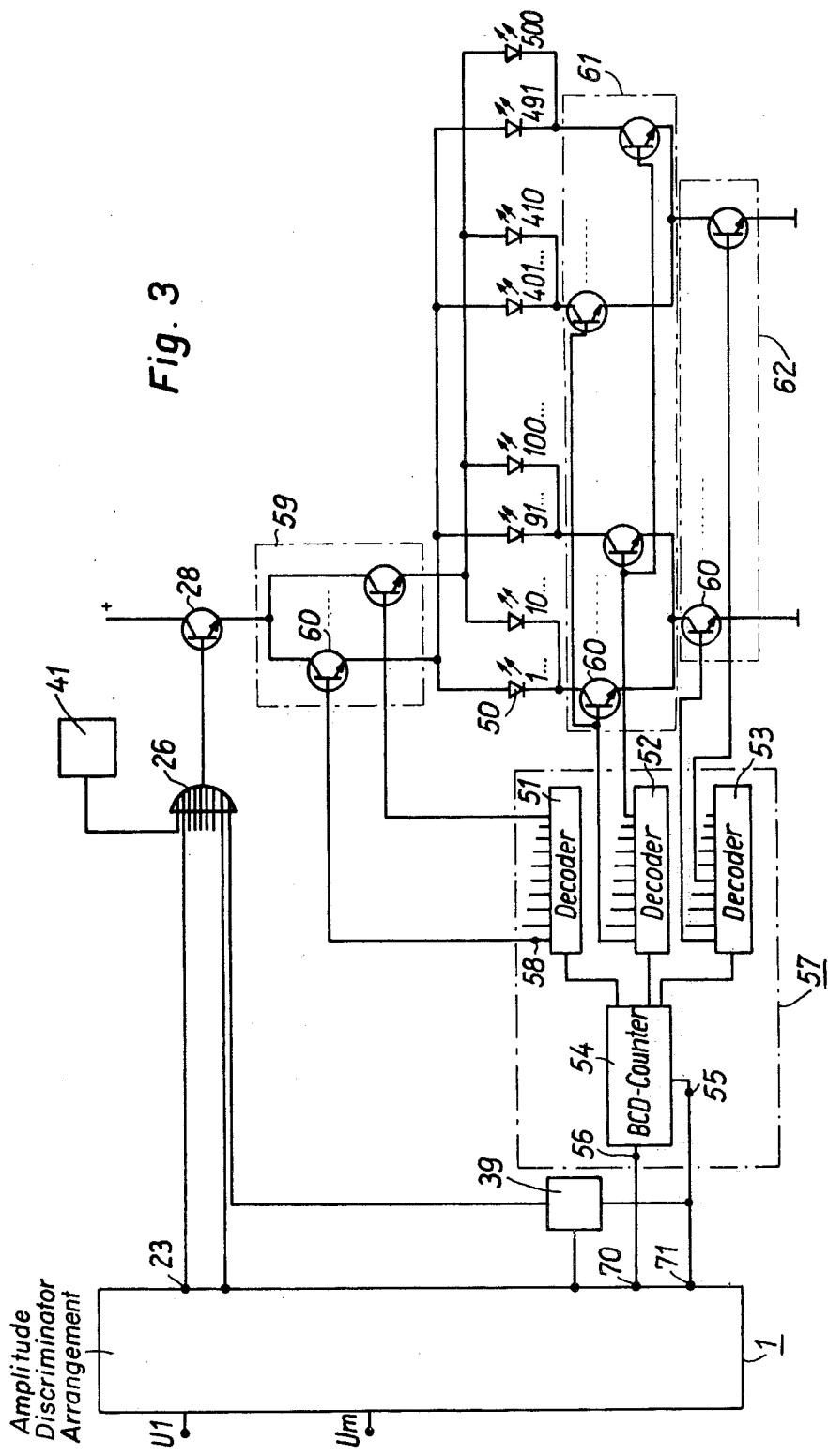

APPARATUS FOR RECORDING VARIABLE MEASUREMENT QUANTITIES THAT CAN BE TRANSLATED INTO ELECTRICAL CURRENT OR VOLTAGE VARIATIONS

BACKGROUND OF THE INVENTION

1. Field of the Invention

This invention concerns apparatus for optically recording on a moving, light sensitive record carrier variable measurement quantities that can be translated into electrical current or voltage variations. In particular, it concerns apparatus comprising a row of light-emitting components which are arranged transversely to the direction of motion of the record carrier and, in addition, an amplitude discrimination arrangement associated with such components for causing the components to emit light onto the record carrier for given amplitude values of the measurement quantities.

2. Description of the Prior Art

In one known apparatus of this kind (German Offenlegungsschrift No. 1,918,771), electroluminescent components are used as the light-emitting components, and a light-sensitive paper or a film, which changes it charge distribution as a function of emitted light, serves as the record carrier. Nothing can be found in the aforementioned Offenlegungsschrift about the design of the amplitude discriminator arrangement and the excitation circuit of the individual light-emitting components.

A device for recording phenomena and, in particular, rapid phenomena that can be translated into electrical current or voltage variations, is known (German Auslegschrift No. 1,448,820) which comprises a row of writing elements arranged in the manner of a comb. The writing elements used are, for instance, semiconductor diodes, specifically, gallium arsenide diodes. The writing elements are driven by a set of mechanically inertialess discriminators which set in operation, individually and automatically, each associated writing element if the recorded current or voltage values fall into a given narrow interval of the measuring range, the individual intervals sequentially covering the range of measurement values to be recorded essentially without gap. It cannot be seen from the aforesaid Auslegeschrift how the discriminators are constructed and in which manner the writing elements are driven by them.

It is also known to employ an oscillograph (U.S. Pat. No. 2,907,622) which comprises several recording elements arranged in a row in the manner of a comb. Each of the recording elements is connected with a series resonant circuit. Additionally such elements are jointly connected on their input sides via amplifiers to the outputs of frequency modulators. An oscillator, which delivers an alternating quantity with a given frequency, is associated with each frequency modulator. The alternating quantity is frequency-modulated by a measurement quantity to be recorded, which quantity has been translated into a voltage variation, so that it is then ensured by the appropriately tuned series resonant circuits preceding the writing elements that a measurement value is always recorded by the writing element whose preceding series resonant circuit is tuned to the frequency characterizing this measurement value.

This above-mentioned oscillograph is disadvantageous in that a relatively large amount of circuitry is required for driving the individual recording elements, i.e, an oscillator and a frequency modulator and a resonant circuit are required for each measurement quantity to be recorded.

It is, therefore, an object of the present invention to provide apparatus for optically recording variable measurement quantities via an amplitude-discriminator arrangement which can be manufactured at comparatively low cost.

SUMMARY OF THE INVENTION

In accordance with the principles of the present invention the above and other objectives are realized by an amplitude discriminator arrangement comprising an integration arrangement which is connected to a reference voltage source and which has an output which is always connected to one of the inputs of a plurality of comparators, the other inputs of the latter comparators being acted upon, respectively, by the measurement quantities to be recorded. More specifically, the outputs of the comparators are connected, respectively, to an OR logic circuit to which a control terminal of an electronic switch is connected. The electronic switch is arranged in an auxiliary circuit in series with further electronic switches and the light-emitting components. These further electronic switches, in turn, are actuated by a cyclically operating control device or unit, which begins its operating cycle with each start of the periodically repeated integration of the integration arrangement.

The advantage of the above-described discriminator of the present invention is that by employing the aforesaid periodically operating intergration arrangement together with the comparators the control unit operating synchronously therewith, the rise of the output voltage of the integration arrangement causes those light-emitting components to be prepared for excitation which are associated with a given value of the measurement quantities. The order of the interrogation of the individual measurement quantities to be recorded is thus not fixed, since it depends exclusively on the magnitude of the value of the individual measurement quantities at the moment of the interrogation. Multiplex operation with as many measuring channels as desired is, therefore, possible without reduction of the upper cutoff frequency.

The discriminator of the present invention also includes a voltage-frequency converter, having an output which is connected, via a frequency divider, to a reset input of the integration arrangement and to a start input of the control device. The output of the converter, additionally, is directly connected to the stepping input of the control device. The input of the converter, on the other hand, is advantageously connected to a reference voltage source. Through this arrangement of the voltagefrequency converter and the described interlinking of the integration arrangement and the control device, the integration arrangement is made to operate in the same cycle as the control device, so that the addressing of a given light-emitting component is always reliably associated with a given value of the output voltage of the integration arrangement. A different arrangement, involving the generation of a frequency, can, of course, also be employed instead of a voltage-frequency converter.

The control device of the present discriminator arrangement can, in accordance with the invention, be designed in a variety of ways. However, it is advantageous if the control device comprises a shift register having storage elements which correspond in number to the number of light-emitting components and which act sequentially on the control terminals of that respective further electronic switchs which are arranged in series with the corresponding light-emitting components. In this design of the control device, an electronic switch is associated with each light-emitting component, in addition to the electronic switch connected with its control terminal to the OR logic circuit. Relatively many electronic switches are, therefore, required.

In order to reduce the number of the further electronic switches, it is advantageous if the control device comprises a BCD counter having a number of decades which is related to the number of light-emitting components. The aforesaid counter is connected on its output side to a group of BCD decimal decoders whose number corresponds to the number of decades of the counter. The BCD decimal decoder associated with the lowest decade of the counter has its outputs, in turn, connected to a first group of ten of the further electronic switches, each such switch being connected in series with the electronic switch and each being connected to the respective light-emitting components associated with a particular ones-ranking. The BCD decimal decoder for the next-higher decade, on the other hand, has its outputs connected to a second group of the further electronic switches, the further electronic switches of this second group always being disposed in series with corresponding tens-blocks of the lightemitting components. Finally, the BCD decimal decoder for the still higher decade of the counter has its outputs connected to the outputs of a third group being connected in series with the respective switches of the second group associated with a particular hundreds-block of the light-emitting components. Through the use of a BCD counter with several decades and of several BCD decimal decoders, the cost for the electronic switches can be reduced to less than 20%.

According to one particularly preferred embodiment of the discriminator arrangement of the present invention, twostage analog storage devices are connected to the comparators acted upon by the respective measurement quantites. The second stage of each such device is periodically released for storing by a pulse from the frequency divider. The two-stage analog storage devices, in turn, have their outputs connected to one of the inputs of auxiliary comparators, the other inputs of these auxiliary comparators being jointly connected to the output of the integration arrangement. Each comparator and its associated auxiliary comparator, moreover, are connected to an Exclusive-OR gate whose output serves as one of the inputs of the OR logic circuit. In this embodiment of the invention, it is possible to also record those measurement values which lie between the measurement values of two succeeding interrogations. Such a result is realized by the use of the two-stage analog storage devices and the auxiliary comparators which together permit those light-emitting components to be excited which are situated between the components at the last interrogation and the interrogation just performed.

As a rule, apparatus for recording variable measurement quantities requires the plotting of a time base. In order to meet this requirement in the discriminator of the present invention, a clock generator is provided whose output is connected to the OR logic circuit. When an output pulse of the clock generator occurs, the electronic switch is opened, and all light-emitting components are addressed by the control device in a time corresponding to the integration period. As a result, a line extending at about a right angle to the recording direction is produced at regular intervals on the record carrier.

In order to also record an amplitude scale, the discriminator of the invention is further provided with a frequency divider whose output is connected with the OR logic circuit and whose input is connected to the voltage-frequency converter.

BRIEF DESCRIPTION OF THE DRAWING

The above and other features of the present invention will become more apparent upon reading of the following detailed description, viewed in conjunction with the accompanying drawing, in which:

FIG. 3 shows a third embodiment of the invention in which the function of the control device is performed by a BCD counter and BCD decimal decoders.

DETAILED DESCRIPTION

Figure 1:
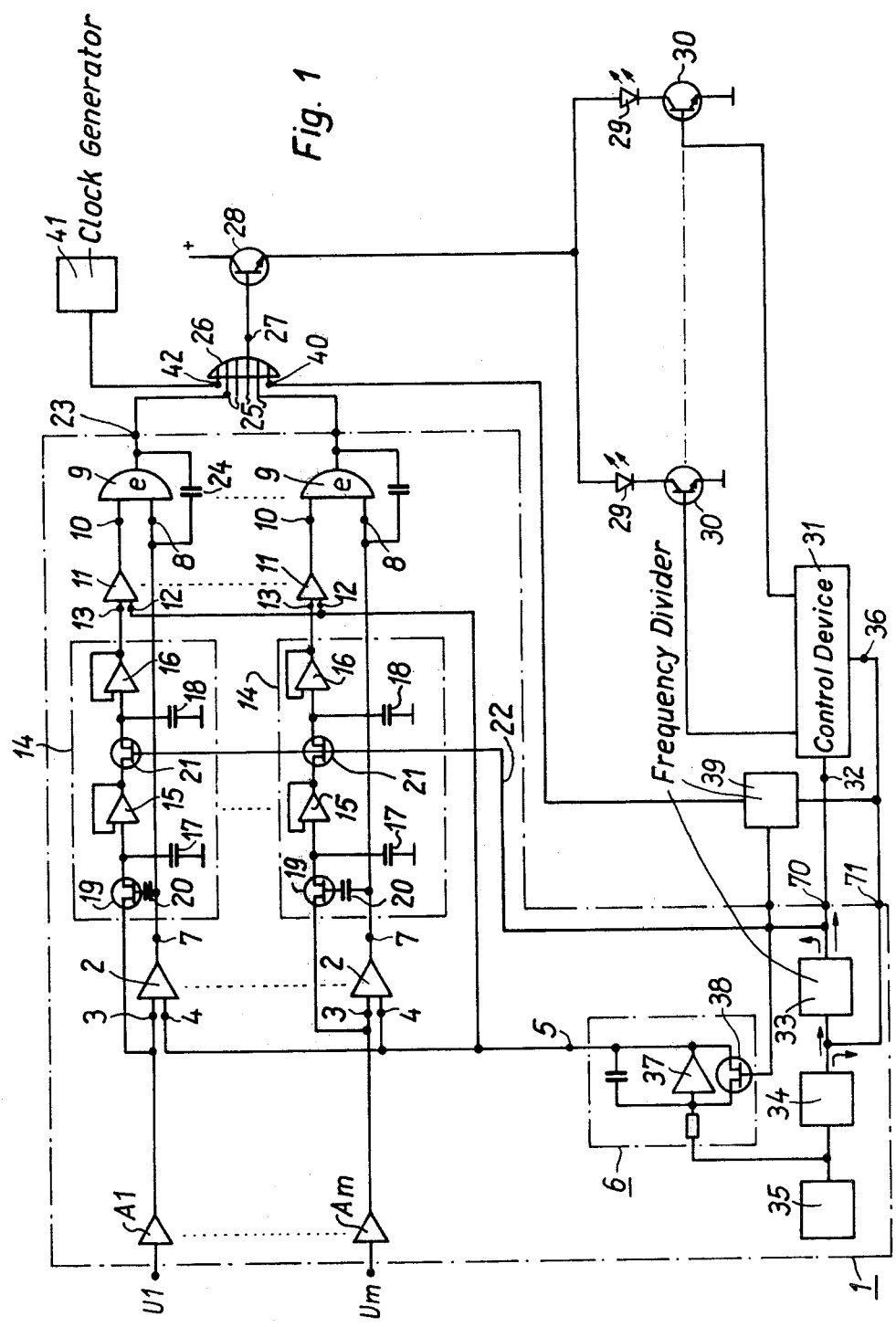
FIG. 1 illustrates a first embodiment of the invention in which a shift register is employed as the control device.

In the embodiment of the apparatus according to the invention shown in FIG. 1, measurement quantities Ul to Um are connected to inputs of input amplifiers Al to Am of an amplitude discriminator arrangement 1. The measurement quantities Ul to Um are first amplified in input amplifiers Al to Am, to each of which one of the comparators 2 is connected via one of its inputs 3. The respective other inputs 4 of the comparators 2 are connected to the output 5 of the integration arrangement 6.

The outputs 7 of the comparators 2 are connected respectively, to inputs 8 of the Exclusive-OR gates 9. The other respective inputs 10 of the Exclusive-OR gates 9 are connected to the outputs of auxiliary comparators 11. The auxiliary comparators 11 are always connected jointly with one of their inputs to the output 5 of the integration arrangement 6. The respective other inputs 13 of the comparators are, in turn, connected to the outputs of two-stage analog storage devices 14.

Each stage of the analog storage devices 14 comprises operational amplifiers 15 and 16, respectively, to the input of which capacitors 17 and 18 are connected. The input of the operational amplifier 15 of the first stage of each analog storage device 14 is connected to the input 3 of the respective comparator 2 via a field effect transistor 19, whose gate is connected with the output of the comparator 2 via a capacitor 20. The two stages of each analog storage device 14 are always connected with each other via a further field effect transistor 21, whose gate is controlled via a line 22 by the reset pulse controlling the integration arrangement 6.

The outputs 23 of the Exclusive-OR gates 9 of the amplitude discriminator arrangement 1, which outputs, incidentally, are connected via capacitors 24 with the respective inputs 8, are additionally connected with the inputs 25 of an OR logic circuit 26. The output 27 of the OR logic circuit 26 is connected to a control terminal of an electronic switch 28, which in the embodiment shown is formed by a switching transistor.

The electronic switch 28 lies in an auxiliary circuit in series with a multiplicity of light-emitting components 29, each of which is followed by a further electronic switch 30. The control terminals of the further electronic switches 30 are each connected to a storage element of a control device 31 designed as a shift register.

The control device 31 is connected at its reset input 32, via a further output 70 of amplitude discriminator arrangement 1, to a frequency divider 33, whose input is connected to a voltage-frequency converter 34. To the voltage-frequency converter 34, in turn, is fed a reference voltage 35. The stepping input 36 of the control device 31 is connected, via an additional output 71 of the amplitude discriminator arrangement 1, directly with the output of the voltage-frequency converter 34.

To the reference voltage source 35 is also connected the input of the integration arrangement 6. The integration arrangement 6 comprises an operational amplifier 37 wired as an integrator, whose output is connected with its input via a field effect transistor 38. The gate lead of the field effect transistor 38 is connected with the output of the frequency divider 33.

The apparatus of FIG. 1 operates in accordance with the invention in such a manner that, beginning with the start of the integration by the integration arrangement 6, the individual storage elements of the control device 31 are acted upon sequentially, so that the further electronic switches 30 are closed one after the other. With the start of the integrating process, a voltage of linearly increasing magnitude is delivered also to the output 5 of the integration arrangement 6, so that on the basis of a comparison of this output voltage with the instantaneous value of the measurement quantities Ul to Um to be recorded, an output pulse is always given off by means of the comparators 2 by that Exclusive-OR gate 9 whose corresponding measurement quantity has at the moment the then prevailing value of the output voltage of the integration arrangement 6. Through the output pulse of the Exclusive-OR gate 9, a pulse is given via the OR logic circuit 26 to the control terminal of the electronic switch 28, whereby the latter is opened. Thereby, current flow via the switch 28 is prepared so that, when a further electronic switch 30 is released by the control device 31, the light-emitting component connected in series with the former is excited. The light produces a mark on a suitable record carrier. During one integration phase of the integration arrangement 6 and a corresponding operating cycle of the control device 31, all the measurement quantities Ul to Um to be recorded are thus interrogated and, due to the corresponding opening of the electronic switch 28 and to the further operation of the electronic switches 30, are marked by the light-emitting components 29 on the record carrier.

In order to also be able to plot the course of the measurement quantities being recorded between two interrogations, which is of interest particularly if the quantities being measured change rapidly, the two-stage analog storage devices 14 are provided. Devices 14 first store in their first stages those values of the measured quantities which are present when the comparators 2 are first switched over. If the frequency divider 33 transmits a reset pulse to the integration arrangement 6 and a start pulse to the control device 31, the field effect transistors 21 are made to conduct between the two stages of the analog storage device 14, and, as a result, the aforesaid stored values are transmitted from the first stages to the second stages of the analog storage devices 14. The stored values are, therefore, present at the inputs 13 of the auxiliary comparators 11. In the following integration phase of the integration arrangement 6, the output voltage of the integration arrangement 6 is then compared in the auxiliary comparators 11 with the storage quantities present at the respective inputs 13 thereof and, if the values agree, respective output pulses are given to the inputs 10 of the Exclusive-OR gates 9. As a signal may be present at the input 10 for a certain time, due to the stored value, if the measurement quantity changes much in the meantime, several light-emitting components 29 correspondingly connected in series with the electronic switches are excited to emit light because the electronic switch 28 is energized and several further electronic switches 30 are actuated, so that, therefore, all the light-emitting components are excited which have occurred in connection with a measuring quantity between the measurement values of two succeeding interrogations. The capacitors 24, which connect the inputs 8 of the Exclusive-OR gates 9 with their outputs 23 have the purpose here to permit the pulses derived from their respective comparators 2 to be transmitted to the OR logic circuit 26.

As may further be seen from FIG. 1, a further frequency divider 39 is connected with its input to the output of voltage-frequency converter 34 and its output to a further input 40 of the OR logic circuit 26. The frequency divider 39 is also connected with the output of the frequency divider 33, to ensure that it operates in synchronism with the other parts of the apparatus according to the invention. The frequency divider 39 makes possible the plotting of an amplitude scale, as through this further frequency divider 39, the electronic switch 28 is actuated in every integration phase after a definite time from the start of the integration, so that then, a given electronic switch 30 is always also enabled by the control device 31 and causes a corresponding mark on the record carrier via the associated light-emitting component.

In the apparatus according to the invention, there is further provided a clock generator 41 whose output is connected with an additional input 42 of the OR logic circuit 26. When the output pulse of the clock generator 41 occurs, the electronic switch 28 is opened and, as the further electronic switches 30 are actuated sequentially, the excitation of the light-emitting components 29 takes place sequentially, which results in a line nearly perpendicular to the motion of travel of the record carrier.

Figure 2:
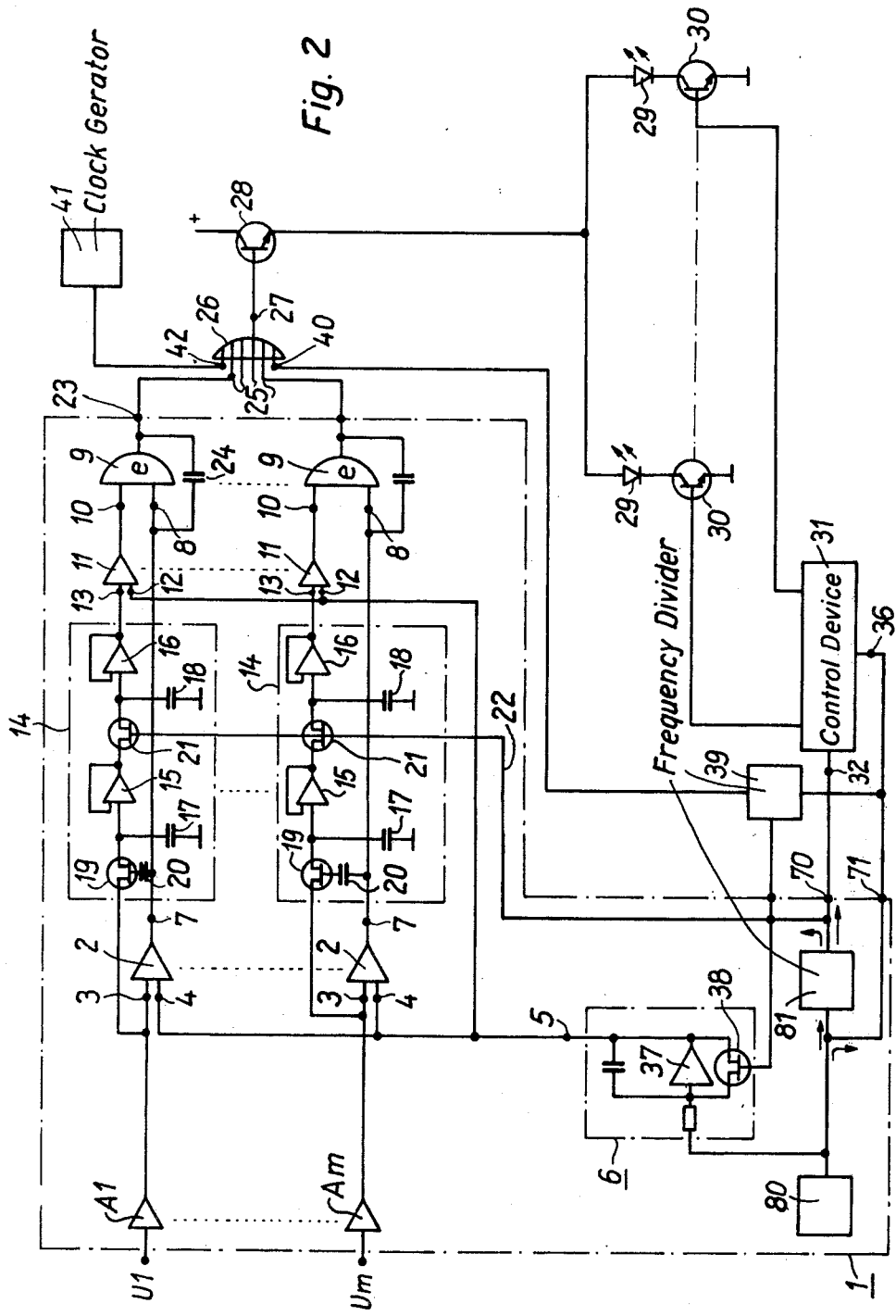
FIG. 2 illustrates a second embodiment of the invention which also employs a shift register as the control device.

The embodiment of the invention shown in FIG. 2 differs from the embodiment of FIG. 1 in that the converter 34 has been removed and the reference voltage source has been replaced by a pulse generator 80 which generates pulses with equal voltage-time integral. As shown, the pulse generator 80 is connected to the input of the integration arrangement 6, to the stepping input 36 of the control device 31 and to a frequency divider 81. As also shown, the frequency divider 81 is connected on its output side in a similar manner as frequency divider 33 of FIG. 1, i.e, to the gate of the field effect transistor 38 of the integration arrangement 6, to the reset input 32 of the control device 31 and to the inputs 12.

In FIG. 3, another embodiment of the invention is shown. The embodiment of FIG. 3 differs from the embodiment of FIG. 1 by the employment of a different arrangement of electronic switches for use with the light-emitting components. Since the amplitude discriminator arrangement agrees with that of FIG. 1, it has been illustrated only as a block designated 1.

The embodiment of FIG. 3 is an apparatus with, for instance, 500 light-emitting components designated as 50. The light-emitting components 50 are driven by an electronic switch, arrangement which is to be described in greater detail hereinbelow, by a BCD decimal decoder 51 for the lowest decade, by a BCD decimal decoder 52 for the next-higher decade and by a further BCD decimal decoder 53 for a still higher decade. The inputs of the BCD decimal decoders 51 to 53 are connected to a BCD counter 54 having several decades. The stepping input 55 and the start input 56 of the latter counter are connected to the amplitude discriminator arrangement 1 in a similar manner as already explained in connection with the description of the shift-register 31 of the embodiment of FIG. 1. The BCD counter 54 and the BCD decimal decoders 51, 52 and 53 constitute a control device 57. The BCD decimal decoder 51 for the lowest decade is connected with its outputs to a first group 59 of the electronic switches 60. The electronic switches 60 of the first group 59 are, in turn, arranged in series with the electronic switch 28. Each of these electronic switches 60 is connected to those light-emitting components 50 having a particular corresponding ones-ranking. More specifically, as depicted, the light-emitting components having the numeral ending with a 1 are connected with the switch 60 furthest to the left in FIG. 3, while the light-emitting components with the next-following end numerals are connected to the electronic switches 60 which follow to the right in FIG. 3.

The light-emitting components 50 of each decade are jointly connected to one switch of a second group 61 of electronic switches 60. Accordingly, in the embodiment shown, there are connected to the output of the BCD decimal decoder 52 furthest to the left in FIG. 3, the respective electronic switches 60 of the second group 61 which are in series with the respective first decade of each of the hundreds-blocks of the light-emitting components 50. The outputs of the BCD decoder 52 which follow to the right, in turn, are connected to the electronic switches 60 of the second group 61 which are connected in series with the respective succeeding decades of each hundreds-block of the light-emitting components.

To the BCD decimal decoder 53 for a still higher decade, a respective further group 62 of electronic switches 60 is then connected, each of which is in series with the respective electronic switches 60 of the second group 61 which are arranged in series with a particular hundreds-block of the light-emitting components 50. In the case of 500 light-emitting components 50, the first 5 outputs of the BCD decimal decoder 53 are thus connected with control terminals of the electronic switches 60 of group 62.

A BCD counter which can be used as counter 54 is described, as to its basic design, with one decade in the book by K. Steinbuch, "Taschenbuch der Nachrichtenverarbeitung" (Information Processing), 2nd edition, 1967, pages 507 and 508, and is also described, in an integrated circuit form, in Siemens Datenbuch 1972/73 "Integrierte Schaltungen" (Integrated circuits), pages 138 and 139. Additionally, each of the BCD decimal decoders 51 and 53 can be an integrated circuit such as is described in Siemens Datenbuch 1972/73 "Integrierte Schaltungen", pages 72 and 73.

Since the operation of the apparatus according to FIG. 3 is identical with that according to FIG. 1, a description of such operation is not believed necessary and hence will be dispensed with.

What is claimed is:

1. Apparatus for use in controlling the operation of a row of light-emitting components, said components being arranged transversely to the direction of motion of a light sensitive record carrier and being used to optically record thereon variable measurement quantities that can be translated into varying electrical signals, comprising:
   an amplitude discriminator arrangement for causing said components to emit light onto said record carrier for given values of said quantities including:
   a periodically operating integration arrangement having an input and an output;
   a voltage reference source connected to said input, and
   a number of comparators, each comparator having a first input connected to the output of said integration arrangement and a second input to which one of said electrical signals are applied, each of said comparators further having an output;
   an OR logic circuit having a plurality of inputs connected to corresponding ones of said outputs of said comparators;
   a first electronic switch having a control terminal coupled to the output of said OR logic circuit;
   an auxiliary circuit including said first electronic switch and a first number of further electronic switches, said first electronic switch being arranged in series with said further electronic switches and with said components;
   a cyclically operating control device for actuating said further switches; and,
   frequency means for controlling the periodic operation of said integration arrangement and for actuating said control device to begin operation anew with each start of the period of operation of said integration arrangement.

2. Apparatus in accordance with claim 1, said frequency means comprising:
   a frequency divider having an output connected to a reset input of said integration arrangement and to a start input of said control circuit;
   and, a voltage-frequency converter having an input connected to said source and an output connected to said frequency divider and to a stepping input of said control device.

3. Apparatus in accordance with claim 2, said frequency means further including:
   a further frequency divider having an output connected to an input of said OR logic circuit and an input connected to the output of said converter.

4. Apparatus in accordance with claim 1 in which:
   said source generates output pulses each of which has an equal voltage-time integral;
   and said discriminator arrangement further includes a frequency divider having an output connected to said control device and an input connected to said source.

5. Apparatus in accordance with claim 1 in which:

each of said first number of further electronic switches is arranged in series with one of said components;

said control device comprises a shift register having a plurality of storage elements corresponding to respective ones of said light-emitting components; each of said storage elements being coupled to the control terminal of a corresponding one of said further electronic switches whereby said storage elements sequentially actuate said further electronic switches in response to said stepping input.

6. Apparatus in accordance with claim 1 in which:

said first number of electronic switches form a first group of ten switches each one of which is connected to a different first group of components, those components of a particular first group of components having a corresponding ones ranking;

said apparatus further includes a second number of further electronic switches arranged in second and third groups, each of said second group being connected to one tens-block of said components and each of said third group being connected to said switches of said second group associated with one hundreds-block of said components;

said control device comprises:

a BCD counter having a number of decades determined by said components;

BCD decimal decoders whose number corresponds to the number of decades of said counter, each of said decoders having an input coupled to the output of said counter, the decoders associated with the lowest decade, next highest decade and still a higher decade of said counter being connected, respectively, with the switches of said first, second and third groups of switches.

7. Apparatus in accordance with claim 2 in which said discriminator arrangement further includes:

a number of two-stage analog storage devices each having a first stage with an input connected to said second input of one of said comparators, each of said storage devices further including: a second stage, and switch means connected to the output of said frequency divider for periodically connecting said second stage to said first stage in response to an impulse from said frequency divider whereby the value storage in said first stage is transferred into said second stage;

a number of auxiliary comparators, each of said auxiliary comparators having a first input connected to the output of one of said storage devices and a second input connected to the second inputs of the other auxiliary comparators and to the output of said integration arrangement;

a number of Exclusive-OR gates having outputs connected to said OR logic circuit, each of said gates have one input connected to one of said comparators and another input connected to one of said auxiliary comparators associated with said one comparator.

8. Apparatus in accordance with claim 1 further including:

a clock generator having an output connected to an input of said OR logic circuit.

* * * * *